United States Patent
Conn

(10) Patent No.: US 6,897,663 B1
(45) Date of Patent: May 24, 2005

(54) OPTICAL TESTING PORT AND WAFER LEVEL TESTING WITHOUT PROBE CARDS

(75) Inventor: Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/941,282

(22) Filed: Sep. 15, 2004

Related U.S. Application Data

(62) Division of application No. 10/461,284, filed on Jun. 13, 2003, now Pat. No. 6,815,973.

(51) Int. Cl.[7] .............................................. G01R 31/302
(52) U.S. Cl. ..................................................... 324/750
(58) Field of Search ................................ 324/765, 751, 324/752, 753, 158.1, 763, 767; 356/394, 218, 73

(56) References Cited

U.S. PATENT DOCUMENTS

| | | | |
|---|---|---|---|
| 6,127,837 A | | 10/2000 | Yamamoto et al. |
| 6,323,693 B1 | | 11/2001 | Park |
| 6,400,173 B1 | | 6/2002 | Shimizu et al. |
| 6,448,802 B1 | * | 9/2002 | Hirt ............................ 324/765 |
| 6,586,953 B1 | * | 7/2003 | Okayasu ...................... 324/753 |
| 6,590,410 B2 | * | 7/2003 | Hirt ............................ 324/765 |
| 6,617,862 B1 | * | 9/2003 | Bruce .......................... 324/752 |
| 6,650,130 B1 | | 11/2003 | Kash et al. |
| 6,676,304 B1 | * | 1/2004 | Coin et al. ...................... 385/89 |

* cited by examiner

*Primary Examiner*—David Zarneke
*Assistant Examiner*—Tung X. Nguyen
(74) *Attorney, Agent, or Firm*—T. Lester Wallace; Kim Kanzaki

(57) ABSTRACT

A wafer of integrated circuits under test (ICUT) is tested by supplying power to the ICUTs using power and ground traces that extend between rows of the ICUTs in scribe streets. Test information is supplied to each ICUT by transmitting the test information optically onto the entire wafer. A diode on each ICUT receives the optical test information. The ICUT uses the test information to perform a self-test. Each ICUT has a diode for transmitting optical test information. All ICUTs on the wafer transmit results of the self-tests at the same time. A test device receives the optical test information and identifies the information from each of the many ICUTs, one from another. An entire wafer of ICUTs is therefore tested simultaneously without using a probe card either to power an ICUT or to supply test information to or receive test information from an ICUT.

4 Claims, 6 Drawing Sheets

TEST ALL INTEGRATED CIRCUITS
ON WAFER SIMULTANEOUSLY

OPTICAL TESTING PORT AND WAFER LEVEL TESTING WITHOUT PROBE CARDS

This application is a division of Ser. No. 10/461,284 filed Jun. 13, 2003, now U.S. Pat. No. 6,815,973.

FIELD OF THE INVENTION

The present invention relates to wafer level testing of integrated circuits.

BACKGROUND INFORMATION

In the manufacture of integrated circuits, each one of many integrated circuits on a wafer is typically tested in what is called wafer-level testing. A probe card having a set of probe needles is made such that the pattern of probe needles on the card corresponds with a pattern of wire bond pads on the face side of each integrated circuit on the wafer. The probe card fits into a piece of probe equipment. The probe equipment brings the probe card down into contact with the wafer such that the probe needles of the probe card come into contact with the corresponding bond pads of one of the integrated circuits on the wafer. Power is typically supplied to the integrated circuit via certain of the probe needles that make contact with the power and ground bond pads of the integrated circuit. The remaining probe needles are used to supply test signals to the integrated circuit and to read back test information from the integrated circuit. Once the test information is read back, the testing of the integrated circuit is complete. The test may, for example, indicate that the integrated circuit is defective or that the integrated circuit functioned correctly.

The probe equipment then lifts the probe card up from the integrated circuit and moves the probe card over to the next integrated circuit on the wafer. The process is then repeated such that the second integrated circuit is tested. In this manner, the integrated circuits of the wafer are tested one by one, row by row.

After all the integrated circuits on the wafer have been tested in this manner, the wafer is typically cut along vertically extending and horizontally extending scribe lines so that each individual integrated circuit becomes a separate integrated circuit die. Each good die is then packaged.

Although integrated circuits are generally powered during wafer-level test via probe card needles as described above, special power and ground lines are sometimes provided on the wafer so that power and ground voltages do not need to be provided by probe card needles. Power and ground conductors may, for example, be provided on the wafer to extend between the various integrated circuits of the wafer in the scribe line areas. The scribe line areas between rows of integrated circuits and between columns of integrated circuits are sometimes called scribe streets.

U.S. Pat. No. 6,323,639, for example, describes powering integrated circuits on a wafer using metal lines disposed in wafer scribe line areas. Each integrated circuit has a first pad for receiving a power supply voltage from one such metal line and a second pad for receiving a ground potential from a second such metal line. The probe card does not, therefore, have to contact the power and ground wire bond pads of the various integrated circuits. Rather, power and ground are supplied through the metal lines. To initiate a built-in self-test (BIST) in the integrated circuit, probe needles of the probe card are brought down into contact with bond pads of a first integrated circuit. These bond pads may, for example, receive test information onto the integrated circuit. Once the built-in self-test operation is properly initiated, the probe card moves to the next integrated circuit. The patent describes a method whereby the end of the testing of one integrated circuit overlaps the start of testing of a second integrated circuit. Test results are stored in a non-volatile status register on the wafer. Upon completion of the built-in self-test operation for all the integrated circuits on the wafer, the results of the testing is evaluated. See U.S. Pat. No. 6,232,639 for more details.

Although some problems associated with supplying power and ground to an integrated circuit using probe needles are avoided using techniques set forth in U.S. Pat. No. 6,323,639, certain other problems still remain. The testing of integrated circuits is, for example, still largely sequential. The testing of a wafer involving a large number of integrated circuits is still undesirably slow. Moreover, the needles of the probe card still make landings on integrated circuit bond pads. Probe needles can fail. Probe cards are expensive. A solution to these problems is desired.

In addition to the above-described problems associated with probe cards, the use of probe cards requires that the integrated circuit being tested have pads to which the probe needles can make contact. More and more integrated circuits are, however, being designed to employ flip-chip packaging techniques. In flip-chip packaging, bond pads are not needed to connect the various input/output resources of the integrated circuit die to the package. Rather than using bond wires and bond pads to couple an integrated circuit to its package, microbump structures are provided on the face side of the integrated circuit. To package the integrated circuit, the integrated circuit is flipped upside down such that the microbumps on the face side of the integrated circuit make electrical contact with a corresponding set of landing pads on the integrated circuit package. Bond wires are not used and the microbumps can be made to be quite small. Because the larger bond pads that were used for wire bonding are not required, it is desirable not to have to provide bond pad structures just to support the needs of probe card wafer testing. Accordingly, a rapid and inexpensive wafer testing technique that does not involve the probing of integrated circuits using a probe card and probe needles is desired.

SUMMARY

A wafer of integrated circuits under test (ICUT) is tested by supplying power to the ICUTs using power and ground traces that extend between rows of the ICUTs in scribe streets. Test information is supplied to each of the powered ICUTs by transmitting the test information optically onto a plurality of ICUTs or onto the entire wafer. Each ICUT includes one or more photodetectors usable for receiving the test information. The photodetectors may, for example, be diodes. In one embodiment, all the ICUTs on the wafer receive the test information at the same time. Each ICUT then uses the test information to perform a self-test. The test information may, for example, include JTAG test input signals (TCK, TMS and TDI).

In addition to photodetectors, each ICUT also has a phototransmitter. The phototransmitter is used for transmitting test information optically from the ICUT. The phototransmitter may, for example, be a diode. In one embodiment, all the many ICUTs on the wafer transmit test results optically at the same time. Each ICUT may, for example, include an optical JTAG port and may transmit the results of a self-test optically in the form of the JTAG TDO output test signal.

Light of the optical test information transmitted from all the ICUTs under test is received by an optical sensing device. In one embodiment, the optical sensing device is a CCD camera. An image of the wafer under test is formed on an array of CCD devices in the camera. Light from the various ICUTs appears as specs in the image. The CCD camera discriminates the various optical test signals, one from another, and outputs test information for each of the ICUTs. The resulting test information is then analyzed to determine which of the ICUTs passed self-test and which of the ICUTs failed self-test. An entire wafer of ICUTs is therefore tested simultaneously. If powering an entire wafer of ICUTs requires an excessive amount of power and leads to heat dissipation problems or is otherwise undesirable, then the ICUTs on the wafer can be tested sequentially as a plurality of groups.

Because power and ground is supplied to the ICUTs via traces in scribe streets on the wafer, a probe card is not needed to supply power and ground to the ICUTs. Nor is a probe card needed to supply test information to an ICUT or to read test results back from an ICUT. An entire wafer of ICUTs can therefore be tested simultaneously without using a probe card to power any ICUT, and without using a probe card to supply test information to or receive test information from any ICUT.

The photodetectors used to receive optical information onto an ICUT and to transmit optical information from an ICUT can be silicon diodes fabricated by the same semiconductor process used to fabricate the remainder of the logic of the ICUT. Such diodes may not be particularly efficient photodetectors and phototransmitters, but they can be made to work for the limited purpose of communicating test information between an optical JTAG port on the ICUT and the test device in accordance with the present invention. By using diodes fabricated in the same process used to make the rest of the ICUT, the provision of the optical communication link between the ICUTs and the test device involves no additional semiconductor processing costs. To allow light to be emitted from the diodes on the ICUTs, metalization is not provided over these diodes. Similarly, metalization is not provided over the photodetector diodes so that light can penetrate down to the photodetector diodes.

In one embodiment, a CCD camera is not used, but rather a test device wafer is used to communicate test information to the ICUTs and to receive test information back from the ICUTs. One entire surface of the test device wafer is covered with a sea of photodetectors and phototransmitters. The wafer under test is slid under the test device wafer such that the face of the test device wafer and the face of the wafer under test are parallel to one another and are separated by a small distance. The phototransmitters of the test device wafer transmit optical test information down to the optical JTAG ports of the various ICUTs on the wafer under test. All the ICUTs receive the optical test information at the same time.

Each of the ICUTs performs a self-test, and then transmits its test results back up to the test device wafer in the form of an optical signals. The photodetector/photodetectors on the test device wafer that is/are disposed directly over the ICUT pick up the optical test signal and convert it into an electrical test signal. In this manner, the test information received from one ICUT is picked up in a localized area of photodetectors on the test device wafer immediately above the ICUT, and is not received by other photodetectors elsewhere on the test device. Optical test information received from one ICUT can therefore be identified and separated from test information received from other ICUTs by virtue of which photodetector/photodetectors on the test device wafer is/are receiving the corresponding optical test signal.

The rows and columns of the wafer under test do not have to be specially aligned with respect to the test device wafer in one embodiment where the photodetectors and phototransmitters on the test device wafer are small in comparison to the area of an ICUT. If the rows and columns of ICUTs on one particular wafer under test are rotated with respect to the test device wafer, then a different mapping of photodetectors on the test device wafer to ICUTs occurs, but the same principal of discriminating the test information received from one ICUT from the test information received from another ICUT based on the which photodetector/photodetectors on the test device wafer received the optical signal is still used.

Other structures and methods are described in the detailed description below. This summary does not purport to define the invention. The invention is defined by the claims.

DETAILED DESCRIPTION

Figure 1:
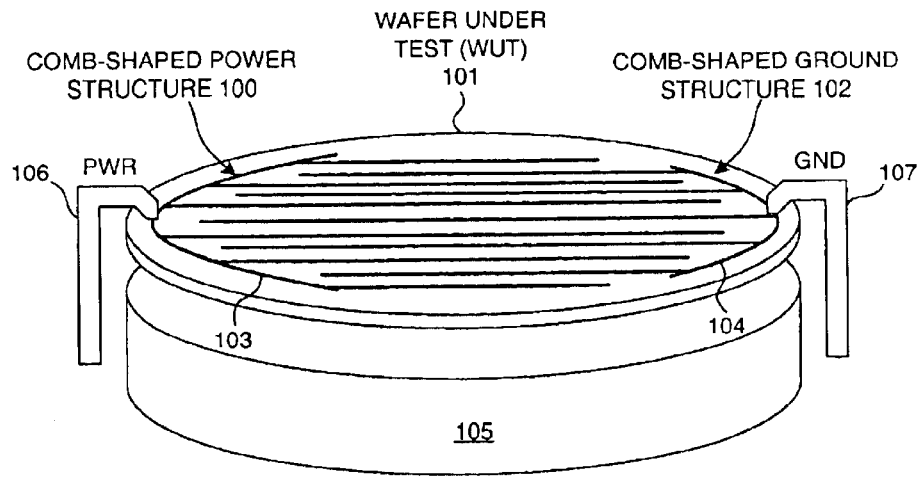
FIG. 1 is a simplified perspective view of a wafer under test in accordance with an embodiment of the present invention.

FIG. 1 is a simplified perspective view in accordance with an embodiment of the present invention. A comb-shaped structure 100 of power conductors is formed on wafer 101. A comb-shaped structure 102 of ground conductors is also formed on wafer 101. In the illustrated example of FIG. 1, the teeth of the comb-shaped power structure 100 extend to the right and are interdigitated with the teeth of the comb-shaped ground structure 102. The teeth of the comb-shaped ground structure 102 extend to the left. In each of the comb-shaped structures, the teeth are connected together by a connecting strip. A connecting strip 103 disposed along the left edge of wafer 101 connects to the teeth of comb-shaped structure 100. A connecting strip 104 disposed along the right edge of wafer 101 connects to the teeth of comb-shaped structure 102.

During wafer test, wafer 101 is held in place on a chuck 105. Chuck 105 is part of a test device in accordance with one embodiment of the present invention. The test device includes a power clip 106 that moves down and makes electrical contact with comb-shaped power structure 100. The test device also includes a ground clip 107 moves down and makes electrical contact with comb-shaped ground structure 102. The power and ground clips may have different forms from the ones illustrated in FIG. 1. The power and ground clips may, for example, be probe needles.

Figure 2:
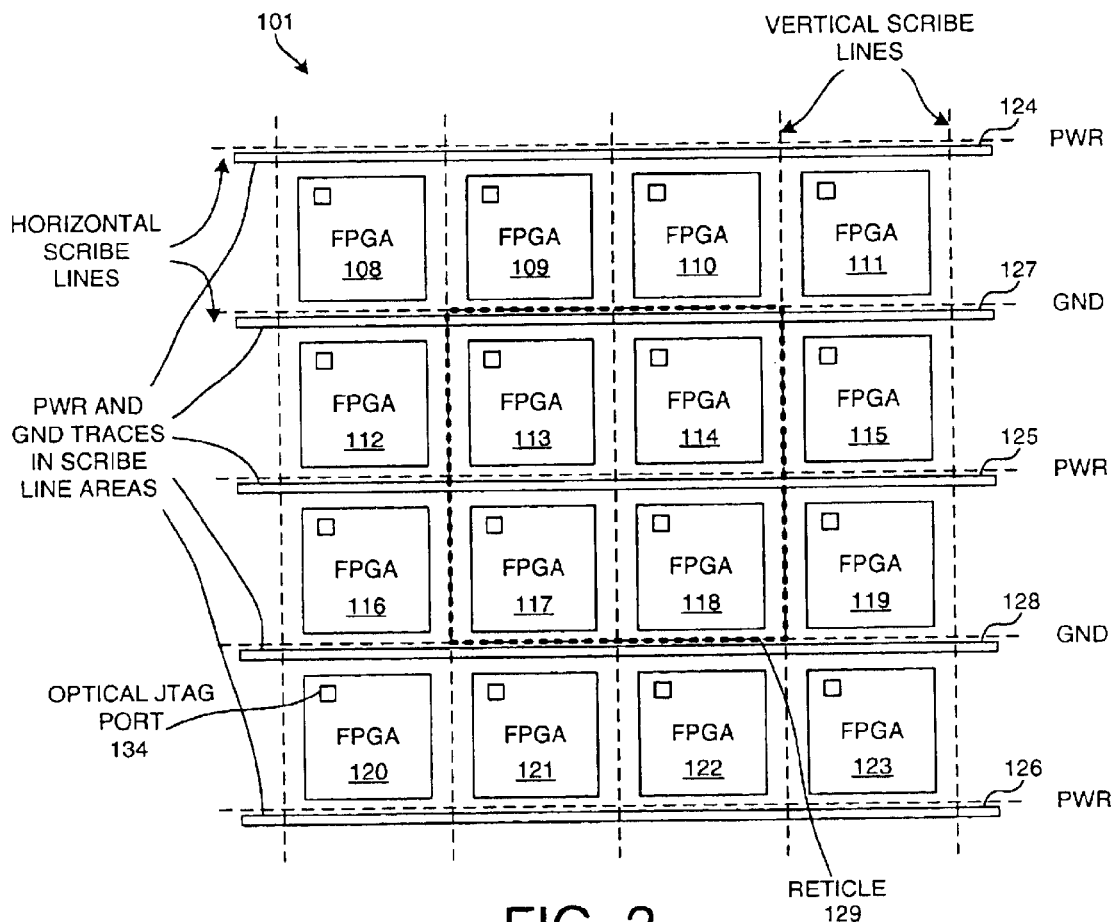
FIG. 2 is an expanded top-down view of the wafer under test of FIG. 1.

FIG. 2 is a more detailed top-down diagram of a part of wafer 101. Wafer 101 includes a plurality of rectangular integrated circuits 108–123 disposed across wafer 101 in a matrix of rows and columns. The horizontally extending traces 124–126 are teeth of the comb-shaped power structure 100. The horizontally extending traces 127 and 128 are teeth of the comb-shaped ground structure 102. As illustrated, the horizontally extending power and ground traces 124–128 extend in scribe streets between the various rows of integrated circuits. Scribe lines where wafer 101 will be cut into discrete dice are represented in FIG. 2 with dashed lines. The integrated circuits as well as the power and ground conductors in the scribe streets may be patterned onto wafer 101 using a reticle and photolithographic techniques. The reticle may, for example, include four integrated circuits and part of a power trace and part of a ground trace. The boundary of such a reticle is illustrated in FIG. 2 with dashed line 129.

Figure 3:
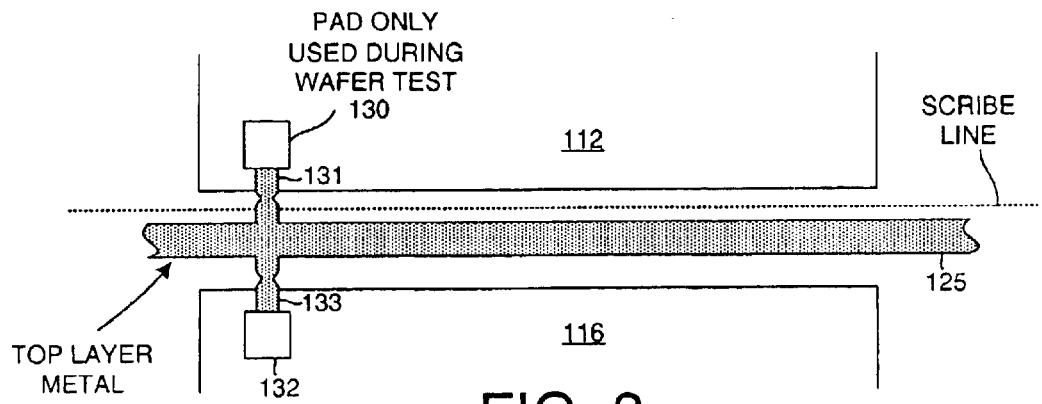
FIG. 3 is an expanded view of a power conductor extending down a scribe street between integrated circuits on the wafer under test of FIG. 1.

FIG. 3 is an expanded view of one of the horizontally extending power traces 125 that extends to the right down a scribe street on wafer 101. Trace 125 has branches that extend upward to pads on the integrated circuits in the row above the trace and that extend downward to pads on the integrated circuits in the row below the trace. In the diagram of FIG. 3, a pad 130 on integrated circuit 112 is coupled to trace 125 via branch 131. A pad 132 on integrated circuit 116 is coupled to trace 125 via branch 133. Each of the power traces 124–126 as well as each of the ground traces 127 and 128 has such a trace and branch structure. In this manner using power and ground pads and associated horizontally extending power and ground traces, all the integrated circuits of wafer 101 are powered at the same time.

Each of the integrated circuits on wafer 101 has the ability to perform a self-test. The circuitry used to perform the self-test can take many different forms. In one specific embodiment, each of the integrated circuits includes a JTAG (Joint Test Action Group) boundary scan testing circuit. The JTAG boundary scan testing circuit in the integrated circuits of FIG. 2 is illustrated as a small rectangle in the upper left corner of an integrated circuit.

Figure 4:
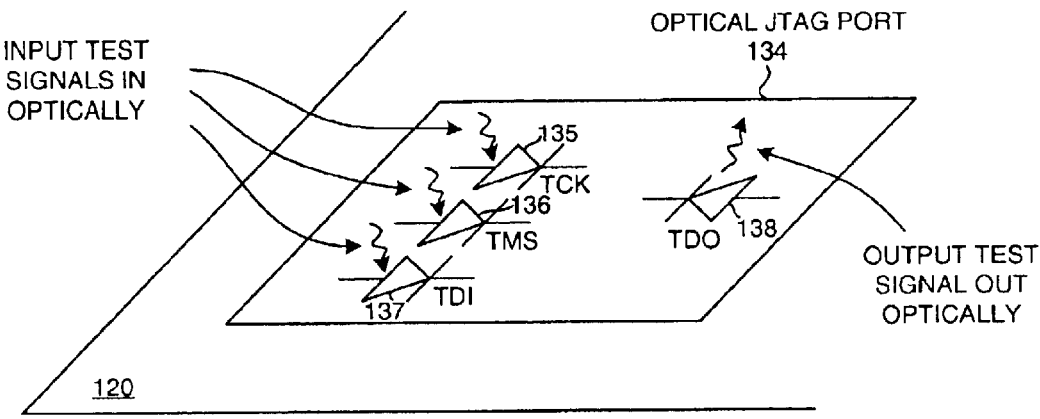
FIG. 4 is a simplified perspective view of photodetectors used to communicate test information optically to an integrated circuit under test and to communicate test information optically from an integrated circuit under test.

FIG. 4 is an expanded view of the optical JTAG boundary scan circuit 134 of integrated circuit 120. The optical JTAG boundary scan circuit 134 receives three input signals TCK (Test Clock), TMS (Test Mode Select) and TDI (Test Data In) and outputs one output signal TDO (Test Data Out). Rather than receiving signals TCK, TMS and TDI electrically by conducting electrical signals from a tester to each integrated circuit being tested, and rather than transmitting signal TDO electrically by conducting an electrical signal from each integrated circuit being tested to the tester, the input and output signals are communicated to and from the integrated circuits optically. Optical JTAG boundary scan circuit 134 includes three photodetectors 135–137 for receiving optical signal TCK, optical signal TMS and optical signal TDI, respectively. Optical JTAG boundary scan circuit 134 includes an optical transmitter such as light emitting diode (LED) 138 for transmitting optical signal TDO. In one embodiment, the integrated circuits being tested are field programmable gate array (FPGA) integrated circuits fabricated on monocrystalline silicon substrate material. The photodetectors 135–137 and the optical transmitter 138 are silicon diodes fabricated using the same semiconductor fabricating processing as the other diodes on the FPGA integrated circuit. To allow optical energy to penetrate from above the wafer and down to the diodes in the silicon substrate, and to allow optical energy to be transmitted up from the silicon substrate and away from the wafer, no metalization is disposed above the photodetector diodes and optical transmitter. Light transmissive materials only are placed above the photodetector diodes and phototransmitter diodes.

In one example, the photodetectors are widely separated from one another to allow easy separation of light destined for the TCK, TMS and TDI photodetectors. By separating the photodetectors, an individual beam of light (one for TCK, one for TMS and one for TDI) can then be directed onto a single corresponding selected one of the appropriate photodetectors. An optical fiber can, for example, be used to direct an individual beam of light onto a local small area of an integrated circuit under test. Multiple such optical fibers can be provided to test a wafer of integrated circuits, one optical fiber being provided for each photodetector on the wafer.

Silicon diodes fabricated using the same semiconductor processing technology used to fabricate the other logic circuitry of the integrated circuit under test may not be very efficient photodetectors and optical transmitters, but such ordinary silicon diodes are suitable for the testing purpose being described here. By using such an ordinary silicon diode for the photodetectors and phototransmitters, the cost of providing the optical JTAG testing interface to the integrated circuits of wafer 101 is reduced. No special processing steps are required to provide the optical JTAG interface.

To detect an optical signal using an ordinary silicon diode fabricated using the same semiconductor processing technology used to fabricate the other logic circuitry of the integrated circuit under test, the diode is reverse biased and the reverse current through the diode is monitored. If optical energy incident upon the junction area of the diode enters the depletion region of the diode, then electron/hole pairs will be generated in the silicon. The electron/hole pairs generated are turned into reverse current due to the influence of the electric field of the semiconductor junction. Accordingly, to detect an optical signal using an ordinary silicon diode, the magnitude of the reverse current flowing in the diode is detected.

Figure 4A:
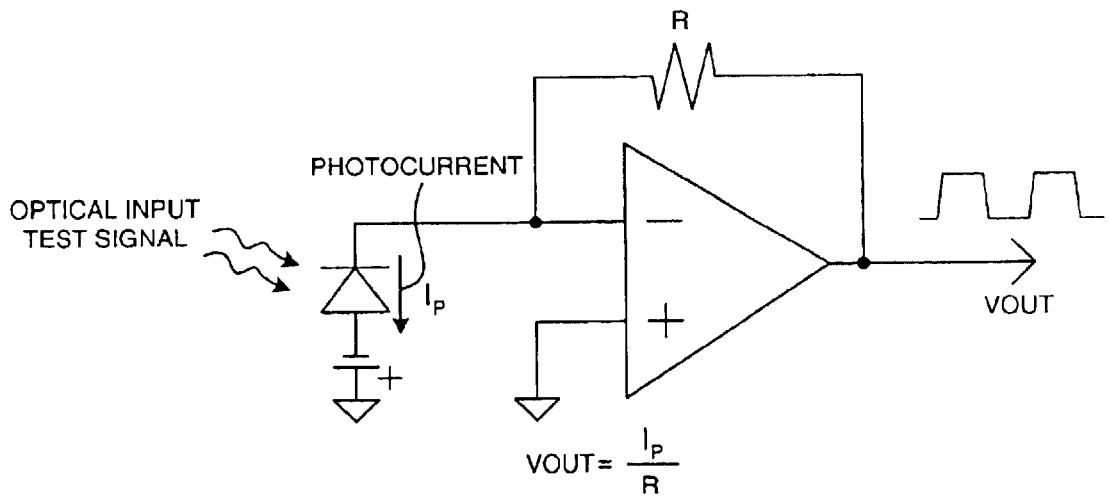
FIG. 4A is a simplified diagram of a circuit usable to amplify a test signal photocurrent received by a photodetector on a wafer under test in accordance with one embodiment.

FIG. 4A is a simplified circuit diagram of an operational amplifier circuit usable to detect an optical signal in accordance with the present invention. Vout of the circuit is related to the photocurrent generated by the diode. The diode is an ordinary silicon diode made using the same semiconductor processing technology used to fabricate the remainder of the integrated circuit under test.

In the embodiment of FIG. 4, an ordinary silicon diode is also used to transmit an optical signal from the optical JTAG port 134. To transmit an optical signal using an ordinary silicon diode, a high reverse bias voltage is placed on the diode so that the diode goes into avalanche breakdown. During avalanche breakdown, the diode outputs optical energy. In the case of an ordinary silicon diode, the optical energy is visible light.

Figure 5:
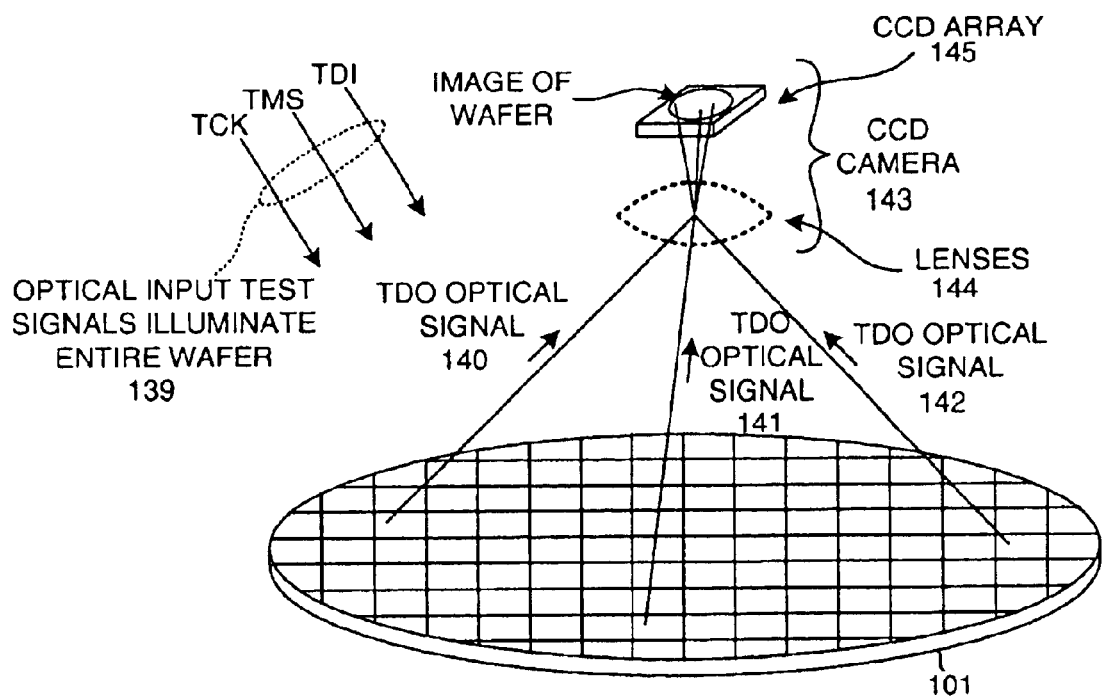
FIG. 5 is a simplified perspective view illustrating the wafer under test of FIG. 1.

FIG. 5 is a simplified view of wafer 101 under test in accordance with an embodiment of the present invention. Wafer 101 is placed in chuck 105 and is held in place, for example by a vacuum. Power and ground clips are coupled to the power and ground structures 100 and 102 as described above in connection with FIGS. 1–3. Optical JTAG test signals 139 are transmitted onto wafer 101 in the form of light from the test device so that the test signals 139 illuminate the entire top surface of wafer 101. The same TCK, TMS and TDI optical signals 139 are received by the photodetectors of all the JTAG circuits at the same time as described above in connection with FIG. 4. Optical signals 139 are used to control the JTAG circuits so that all of the integrated circuits are tested at the same time. The results of the tests are transmitted out of the integrated circuits in the form of TDO output optical signals from the optical transmitting diodes of the JTAG circuits. FIG. 5 illustrates the results of the tests of three integrated circuits being transmitted in the form of TDO optical signals 140, 141 and 142. Although only three TDO optical signals are illustrated, it is understood that each of the many integrated circuits under test on the wafer transmits such a TDO optical signal.

The TDO optical signals are received by an optical pickup device that can receive and differentiate each of the various TDO output optical signals, separate and apart from the others. In the example of FIG. 5, a CCD (charge coupled device) camera 143 is used for this purpose. Lenses 144 of camera 143 focus the TDO optical signals onto a CCD (charge coupled device) array 145 of the camera so that an image of the wafer 101 appears on the CCD array. The light from the many TDO optical signals transmitted from the integrated circuits appear as specks on the image. Each of the individual TDO optical signals is discriminated from the others because it is received onto a separate portion of the CCD array. The CCD array is therefore usable to receive all the TDO optical signals from all the integrated circuits of wafer 101 simultaneously. Each separate TDO signal so received can then be stored and analyzed to determine whether the integrated circuit from which the TDO signal originated passed the self-test. Accordingly, it is seen that an entire wafer of integrated circuits is powered and tested at the same time without the use of a probe card. Test information is loaded into the integrated circuits optically, and test information is collected from the integrated circuits optically.

In one embodiment, each of the input test signals TDI, TMS and TCK is modulated onto a light signal. The light signal acts as a carrier signal. Each of the photodetector diodes 135–137 has a demodulator circuit that recovers the appropriate signal. Each of the input test signals TDI, TMS and TCK can, for example, be frequency modulated onto a different frequency channel where there is one carrier frequency (i.e., the frequency of the light transmitted by diodes 135–137).

Alternatively, three different optical test input signals of different wavelengths are transmitted at the same time onto the three photodetector diodes 135–137 of FIG. 4. The photodetector diodes, rather than using demodulators, are covered by oxide layers of different thicknesses. The thickness of the oxide over a particular photodetector diode is selected to allow only the optical test signal of one of the wavelengths to reach the underlying diode. The two other optical test input signals of different wavelengths are blocked and filtered out by the oxide. In this way, each of the photodetector diodes is covered with oxide such that the diode receives a selected different one of the optical test input signals.

Figure 6:
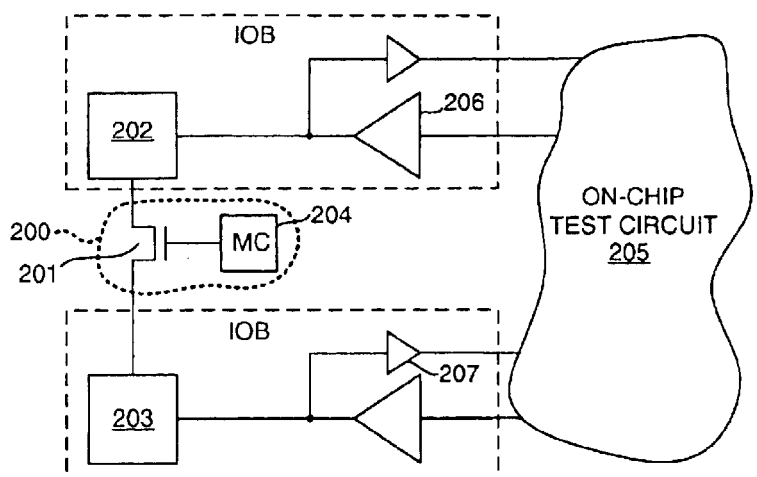
FIG. 6 is a simplified diagram of a circuit added between input/output blocks (IOBs) of an FPGA in order to facilitate testing in accordance with an embodiment of the present invention.

FIG. 6 is a diagram of an additional circuit 200 provided in some embodiments between adjacent IOBs (input/output blocks) of an FPGA integrated circuit that is tested in accordance with the present invention. Circuit 200 includes a pass transistor 201 that can be controlled to couple a first bond pad or microbump 202 to a second bond pad or microbump 203. Configuration information in a memory cell 204 determines whether pass transistor 201 is conductive or non-conductive. During test, memory cell 204 is loaded with configuration information such that pass transistor 201 is conductive. Test information is then supplied to first bond pad or microbump 203 to test it by outputting a test signal from a test circuit 205. This test signal passes through output buffer 206 and first bond pad or microbump 202, through conductive pass transistor 201, and to second bond pad or microbump 203. The test signal then passes back into test circuit 205 via input buffer 207. In this loop-back manner, the continuity of and the proper functioning of the input and output resources of the FPGA integrated circuit are tested.

Figure 7:
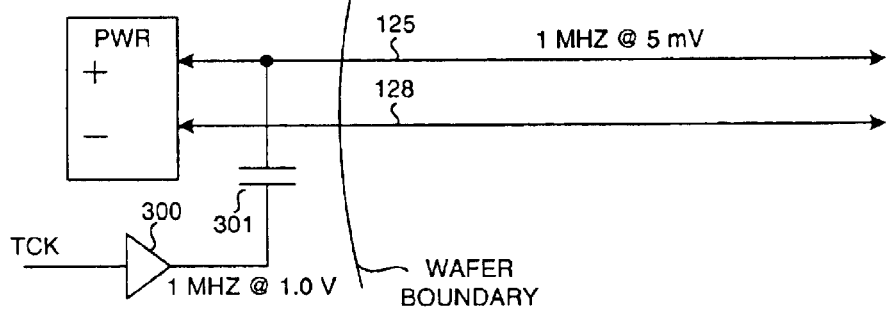
FIG. 7 is a diagram of a circuit for communicating test information across a power conductor either from an integrated circuit under test or to an integrated circuit under test.

FIG. 7 is a diagram in accordance with another embodiment in accordance with the present invention. In this embodiment, test information is communicated between the test device and the many integrated circuits under test across one of the horizontally extending power traces of FIG. 2. In one example, the test information communicated from the test device to the many integrated circuits under test is the TCK input test signal. The TCK test signal in electrical form is supplied to a buffer 300 of the test device. Buffer 300 is AC coupled by a capacitor 301 to power trace 125 (see FIG. 2). Power trace 125 extends across the wafer 101 under test to all the integrated circuits of a pair of adjacent rows as can be seen in FIG. 2.

Figure 8A:
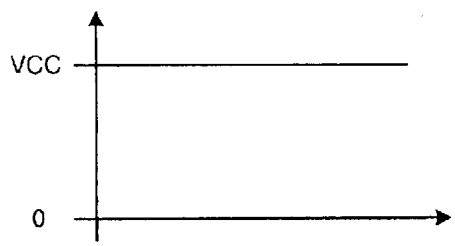
FIGS. 8A and 8B are diagrams illustrating an operation of the circuit of FIG. 7.
Figure 8B:
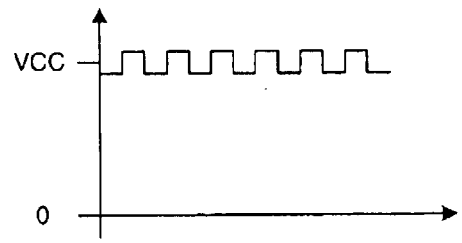
Figure 9:
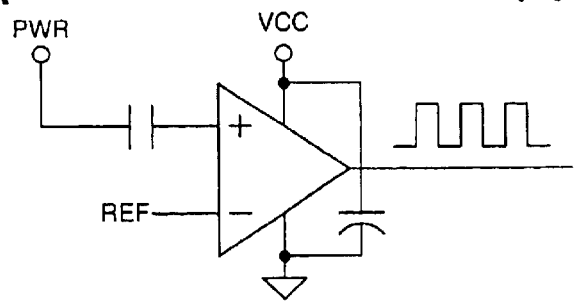
FIG. 9 is a diagram of a circuit usable to detect test information present on a power conductor in accordance with an embodiment of the present invention.

FIG. 8A is a graph illustrating the power voltage (in this case, VCC) present on power trace 125 before the TCK clock signal is coupled onto the power trace. FIG. 8B is a graph illustrating the power voltage present on power trace 125 after the TCK clock signal has been coupled onto the power trace. In FIG. 8B, the TCK signal appears as a 5 millivolt signal superimposed on the larger VCC supply voltage. VCC may, for example, be 3.3 volts. The TCK input signal is communicated over power trace 125 to all the integrated circuits of the row that are powered from power trace 125. Circuitry on the integrated circuits is typically insensitive to power supply voltage fluctuations as small as 5 millivolts. The integrated circuits are therefore powered by the signal of FIG. 8B and are not adversely affected by the smaller amplitude TCK signal present on trace 125. Each of the integrated circuits of the row, however, includes a circuit that detects the TCK signal present on power trace 125 and that level shifts the signal and amplifies it and thereby retrieves the TCK input signal such that the retrieved TCK input signal is usable by JTAG logic on the integrated circuit. FIG. 9 is a simplified diagram of an example of a circuit in each of the integrated circuits suitable for receiving the signal of FIG. 8B and outputting the retrieved TCK input signal. This circuit is present in each of the JTAG circuits of the various integrated circuits under test. The signals TDI and TMS can be transmitted in the same manner over a power trace provided that the signals are first encoded to have adequate transitions (for example, are first Manchester encoded).

Although optical techniques are used in the embodiment of FIG. 5 to send test information to the many integrated circuits under test and to receive test information from the many integrated circuits under test, some or all of the test information may be communicated in other embodiments via conductors on wafer 101. Where there is adequate room in the scribe street areas between adjacent rows of integrated circuits, multiple metal lines can be disposed in parallel. For example, the TCK, TMS and TDI signals can be communicated to all the integrated circuits of a row via three parallel extending conductors. Although it is generally not desirable that the ultimate integrated circuit dice have multiple layers of exposed metal traces on their side-edge surfaces, the TCK, TMS and TDI test signals can be communicated down a row of integrated circuits on wafer 101 via metal traces that are disposed one on top of the other.

Alternatively, traces for conduction of the test signals are provided on the wafer after normal processing in the form of sacrificial metal layers. Where additional sacrificial metal layers are used to provide traces for conduction of the test signals, the sacrificial metal layers can be either partially or entirely removed after testing of the integrated circuits on the wafer.

In the same way that the input test signals can be supplied to the many integrated circuits of a row using metal traces in the scribe street area, so too can the TDO output signals from the various integrated circuits of the row be communicated out to the test device using metal traces in the scribe street area. The TDO output signals can, for example, be communicated over a single trace using time division multiplexing such that each of the integrated circuits outputs its test information in a sequence with respect to the other integrated circuits. The test device receives the test TDO test information over the single trace from the various integrated circuits, one integrated circuit at a time. If the single trace used for this purpose were to be defective, then it may be possible that an entire row of otherwise functional integrated circuits would be identified as defective due only to the failure of the one test trace in the scribe street area. To reduce the probability of this happening, the single test trace is made to be a wider trace of metal. Wider traces are less likely to be manufactured with discontinuities.

In the specific embodiment of FIG. 4, each integrated circuit under test includes multiple photodetector diodes. This need not be the case.

Figure 10:
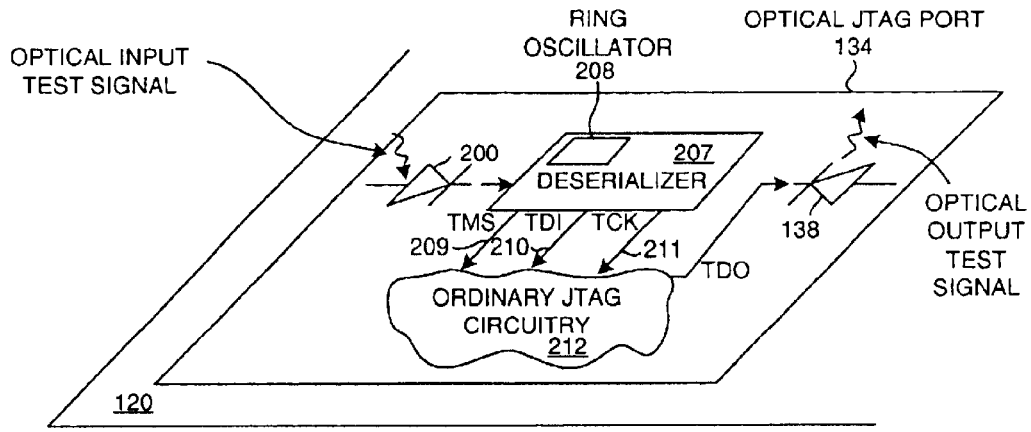
FIG. 10 is a simplified diagram of an optical JTAG port having a single photodetector that receives TMS, TDI and TCK input test signals.

FIG. 10 is a simplified diagram of an embodiment wherein the TCK, TMS and TDI input test information is received onto the optical JTAG port circuitry 134 of an integrated circuit under test 120 via just one photodetector diode 200. The information of each of the TCK, TMS and TDI signals in a time period is combined by the test device into a sequence of multibit words. Each word contains TCK, TMS and TDI information for one time period of a sequence of time periods. Each word is fashioned into a frame by adding a start bit and one or more stop bits in accordance with a serial protocol.

Figure 11:
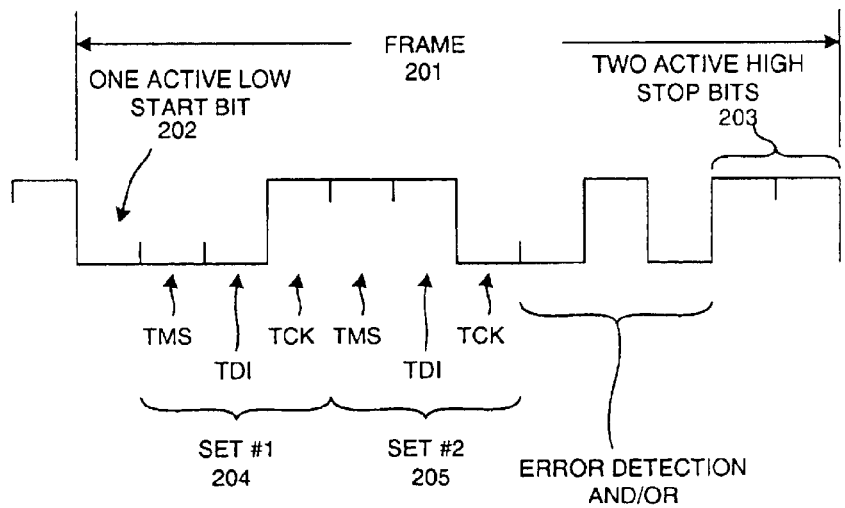
FIG. 11 is a diagram of a frame of optical test information received by the photodetector of FIG. 10.

FIG. 11 is a diagram of one such frame 201. Frame 201 has one active low start bit 202 and two active high stop bits 203. The values of the input signals TMS, TDI and TCK during a first time period are represented by a first set 204 of bits of the frame, whereas the value of the input signals TMS, TDI and TCK during a second time period are represented by a second set 205 of bits of the frame. Error detection and/or correction bits 206 can optionally be provided in accordance with known serial protocols.

The resulting sequence of frames is transmitted optically from the test device to the wafer under test and is received in serial fashion via the single photodetector diode 200. After conversion from an optical signal into an electrical signal, deserializer circuitry 207 in the integrated circuit under test removes the start and stop bits and recovers the sequence of frame payloads in accordance with the serial protocol. The deserializer circuitry may, for example, include a ring oscillator 208 that generated a clock signal. During an initialization procedure, a start frame with a predefined bit sequence is transmitted to the integrated circuit under test. The deserializer counts the number of ring oscillator clock cycles between two known edges of the incoming frame. This count of the number of clock cycles in a known number of incoming bits is then used to determine the number of clock cycles in a bit and to generate a signal for sampling the incoming bit stream in the middle of each subsequent incoming bit. Such circuits are sometimes called autobaud circuits. Alternatively, the count can be used to adjust the ring oscillator frequency such that the number of ring oscillator periods per incoming bit is a predetermined number. Although the autobaud circuit described above uses a clock signal from a ring oscillator to time the duration of incoming bits, other clock signals can be employed in other embodiments. For example, a clock signal received over a power line as set forth in FIG. 7 could be used.

The deserializer 207 samples the bits of incoming frames, removes the start and stop bits to extract the data payload, performs any error detection and correction, and then separates the TCK, TMS and TDI test information in the frame payload. The three input signals TCK, TMS and TDI are regenerated on a frame by frame basis to regenerate the original TCK, TMS and TDI signals. The resulting TCK, TMS and TDI test signals are output on leads 209–211 to the ordinary JTAG circuitry 212 of the optical JTAG port.

Figure 12:
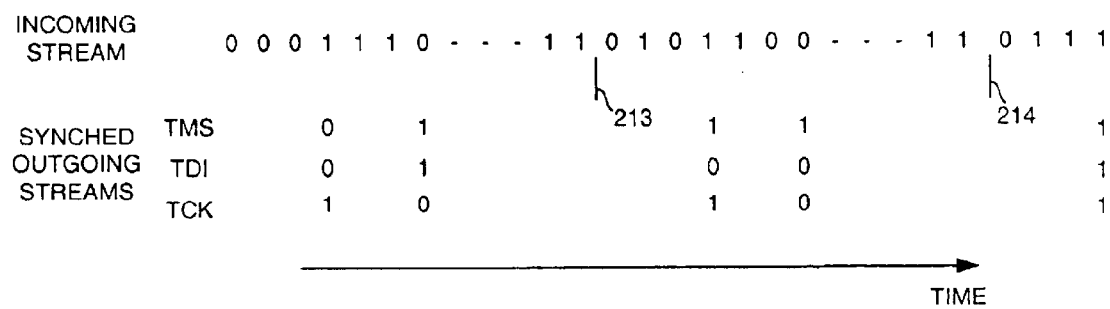
FIG. 12 is a diagram that illustrates how a stream of incoming bits received onto the photodetector of FIG. 10 can be deserialized to generate three synchronized test input signals TMS, TDI and TCK.

FIG. 12 is a diagram that illustrates how an incoming stream of bits of an optical input test signal can be sampled to recover three synchronized JTAG input signals TMS, TDI and TCK. The marks 213 and 214 designate boundaries between frames. The TCK clock signal may be time delayed in the deserializer 207 with respect to the TMS and TDI signals so that the TCK signal can be used by JTAG circuitry 212 to sample the other two input signals TMS and TDI.

By communicating the three test signals serially as illustrated in FIG. 10, the use of multiple demodulators to isolate one input test signal from the others is not required. Although described here in connection with JTAG test circuitry, this technique of communicating multiple test signals to an integrated circuit under test using a single photodetector diode can be used to supply test signals to other types of test circuitry. The description of the simultaneous communication of TCK, TMS and TDI test signals is presented here for illustrative purposes only.

Rather than transmitting bits of the TCK clock signal as discrete bits in the various frames of test input information as described above in connection with FIGS. 11 and 12, the clock signal can be an embedded clock signal. The test input information can, for example, be Manchester encoded to contain an embedded clock. In such an embodiment, deserializer 207 includes circuitry which extracts the clock signal from the incoming Manchester encoded bit stream. This, or other known techniques, can be used to embed a clock signal in the test input information signal transmitted to the ICUTs of the wafer under test.

Figure 13:
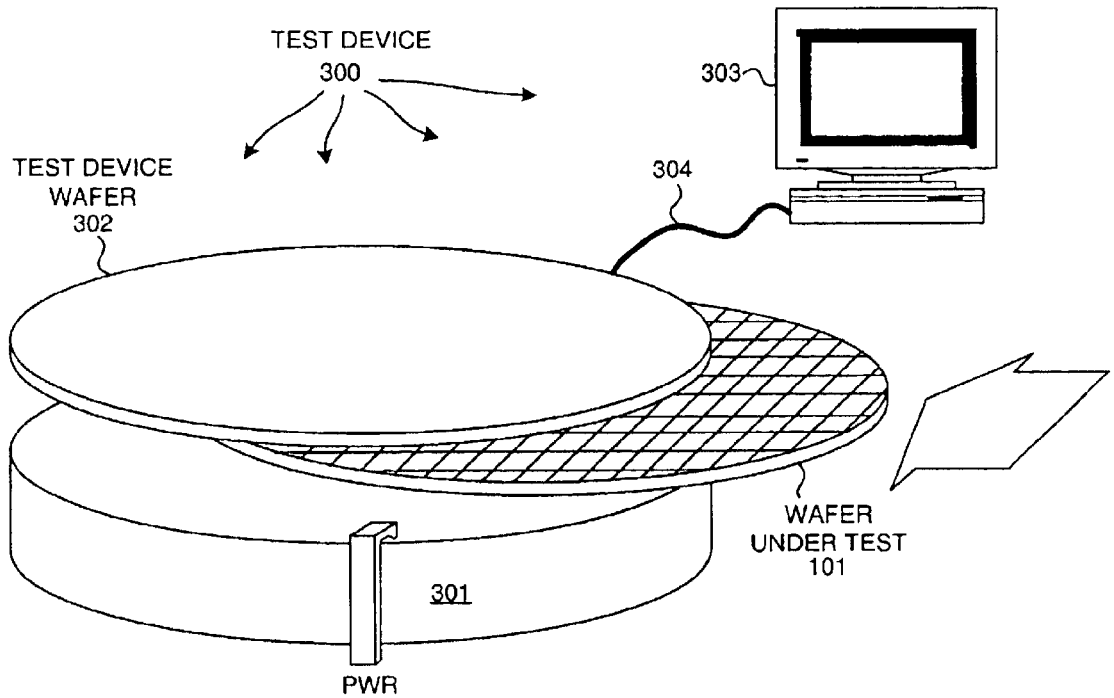
FIG. 13 is a simplified perspective view of a test device involving a test device wafer.

FIG. 13 is a perspective view of a test device 300 in accordance with another embodiment. Test device 300 includes a vacuum chuck 301 having power and ground clips, a test device wafer 302, and an analysis device 303 such as a computer. In the illustrated embodiment, analysis device 303 is a personal computer that is coupled to receive information from test device wafer 302 and to transmit information to test device wafer 302 via a serial communication link 304. The face side surface of test device wafer 302 is covered with a sea of small photodetectors and phototransmitters. The photodetectors and phototransmitters are not seen in the view of FIG. 13 because the test device wafer 302 is disposed face down toward chuck 301.

Figure 14:
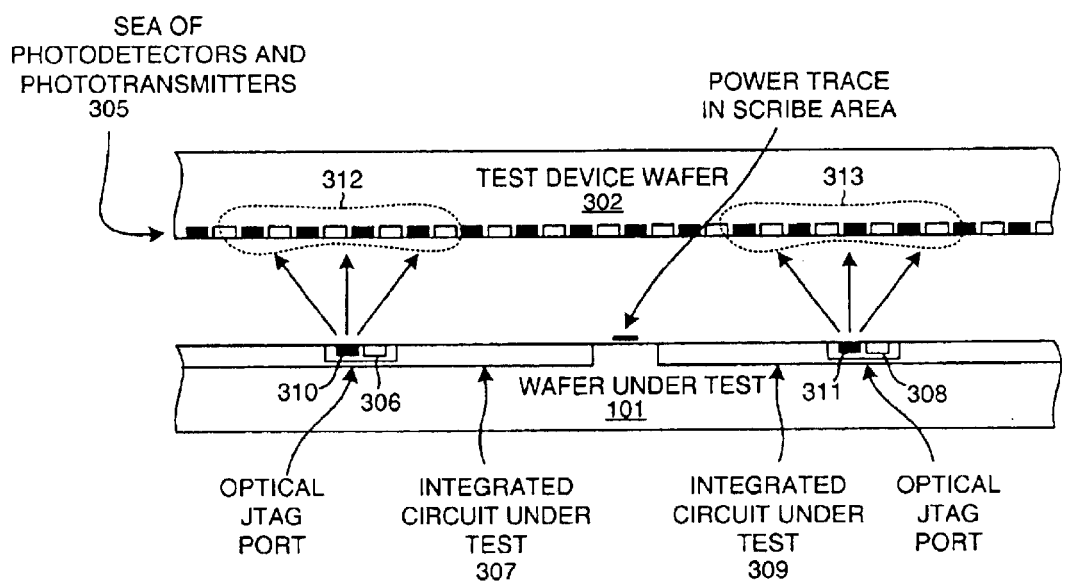
FIG. 14 is an expanded cross-sectional view of a portion of the test device wafer of FIG. 13 as well as a part of a wafer under test.

FIG. 14 is an expanded cross-sectional diagram showing test device wafer 302. The photodetectors and phototransmitters of the test device wafer 302 are indicated by arrow 305.

A wafer under test 101 (see FIG. 13) is slid between test device wafer 302 and chuck 301 as illustrated in FIG. 13. Wafer under test 101 is then sucked down to chuck 301 and held in place by a vacuum. Power and ground clips of test device 300 are moved down to make electrical and physical contact with comb-shaped power and ground structures on the wafer under test as illustrated and described above in connection with FIG. 1. In this fashion, all the ICUTs on wafer 101 are powered.

Once wafer under test 101 is properly positioned in test device 300 and is powered, optical test information is transmitted from all the many phototransmitters on the face side surface of test device wafer 302. In FIG. 14, the phototransmitters are indicated as solid small rectangles. The phototransmitters may, for example, be small light emitting diodes and test device wafer 302 may be a silicon wafer. The same optical test information is therefore communicated at once to all the many ICUTs on wafer under test 101. The optical test information is received by the photodetector of each of the optical JTAG test ports of each ICUT as explained above in connection with FIG. 10.

FIG. 14 illustrates how the optical test information is received by photodetector 306 of a first ICUT 307 and is also received by photodetector 308 of a ICUT 309. As set forth above in connection with the embodiment of 10, the input test information is used by the JTAG circuitry of each ICUT to perform a self-test of the ICUT. Resulting test information from an ICUT is then transmitted from the phototransmitter of the JTAG circuitry of the ICUT upward and to test device wafer 302. In FIG. 14, phototransmitter 310 transmits the results of the self-test of ICUT 307, whereas phototransmitter 311 transmits the results of the self-test of ICUT 309.

The optical test information transmitted from an ICUT is received by one or a small set of the photodetectors that are disposed substantially directly above the ICUT. In FIG. 14, photodetectors in area 312 above ICUT 307 receive optical test information transmitted by phototransmitter 310. Similarly, photodetectors in area 313 above ICUT 309 receive optical test information transmitted from phototransmitter 311. Although there is some lateral dispersion and reflection of light from the phototransmitter of one ICUT to the photodetectors located above another ICUT, the intensity of light dispersed laterally beyond the lateral extent of the ICUT is low. Accordingly, there is one-to-one communication between the phototransmitter of an ICUT and a corresponding set of photodetectors disposed substantially directly above the ICUT. In this manner, the photodetectors of the test device wafer 302 receive the optical test output information transmitted from the many ICUTs of the wafer under test 101. This test output information collected by test device wafer 302 is then communicated to the analysis tool 303 via communication link 304. Analysis tool 303 logs which ICUTs passed their self-tests and which ICUTs failed their self-tests.

Advantageously, the rows and columns of ICUTs on wafer under test 101 do not have to be aligned with respect to test device wafer 302. The photodetectors and phototransmitters of test device wafer 302 are preferably made smaller than the area of the ICUTs. Light transmitted from the array of ICUTs of wafer under test 101 appear as illuminated specs in rows and columns. If wafer under test 101 is rotated with respect to test device wafer 302 when wafer under test 101 is held in chuck 301, then the particular sets of photodetectors on test device wafer 302 that receive the optical test information will likewise be distributed in rows and columns across the test device wafer, where the rows and columns are rotated. The pattern of photodetectors receiving optical test information is easily identified by analysis tool 303 as rows and columns. This is true regardless of whether the rows and columns are rotated or not. Once the pattern is identified, an individual set of photodetectors receiving light within that pattern can be correlated with a particular ICUT.

Mechanisms other than optical mechanisms for communicating test information to and receiving test information from a wafer under test can be employed in accordance with embodiments of the present invention. In one embodiment, a semiconductor test device wafer has pads disposed on one surface. The JTAG circuit of each of the integrated circuits under test has a corresponding set of pads. The test device wafer and the wafer under test are brought into face-to-face relation. The two wafers are not bonded to one another, and do not have to touch one another. Both the pads on the test device wafer and the pads on the wafer under test can be covered by an insulative passivation layer.

The pattern of pads on the test device wafer matches with the pattern of pads on the wafer under test such that pads on the test device wafer are capacitively coupled with corresponding pads on the wafer under test. Test information is then sent from the test device wafer and into the wafer under test via capacitively coupled pairs of pads and is similarly communicated from the wafer under test and out to the test device wafer via capacitively coupled pairs of pads. In this manner, test information is supplied to all the integrated circuits of a wafer under test such that all the integrated circuits are tested at the same time. Results of the tests are then communicated from the integrated circuits and back to the test device wafer all at the same time. After testing, the test device wafer is simply lifted off the wafer under test and is used to test another wafer of integrated circuits. For additional information on capacitively coupled pads that can be used to communicate information between wafers, see U.S. Pat. No. 5,629,838 (the subject matter of which is incorporated herein by reference).

A single test device wafer design can be used to test a variety of different layouts of integrated circuits by providing a tight two-dimensional array of closely-spaced pads that covers the entire bottom surface of the test wafer. Such a test device wafer might look like the test device wafer 302 of FIG. 14, except that the phototransmitters and photodetectors on the face side of test device wafer 302 are replaced with pads. In the testing of a particular wafer under test, only those pads needed to communicate with the integrated circuits under test are used. If when the wafer under test is in place in the test device and a pad on the test device wafer has no matching pad on the underlying wafer under test, then the pad on the test device wafer is simply not used in the testing process. If a wafer with a different set of ICUTs is to be tested, then the same test device wafer can be used. Different ones of the pads on the test device wafer will typically match up with the pads on the ICUTs, and these particular pads on the test device wafer are then the ones that will be used to communicate test information to and from the wafer under test.

Integrated circuits sometimes fail such that they form a short between power and ground. If all the ICUTs in a row on the wafer under test receive power from the same power trace and are grounded by the ground trace, and if a single one of the ICUTs were to fail such that it shorted the power and ground traces, then none of the ICUTs in the row would be properly powered due to the shorting of the power and ground traces. As a consequence, all the ICUTs of the row may fail to transmit back proper output test signals and the ICUTs of an entire row would be discarded due to failing their self-tests. In accordance with one embodiment, the power branch 131 (see FIG. 3) leading into each ICUT has a narrowed portion. Were the ICUT to draw an excessive amount of power, then this narrowed portion of power branch 131 would fuse open, thereby disconnecting the failed ICUT from the power trace.

Although certain specific exemplary embodiments are described above in order to illustrate the invention, the invention is not limited to the specific embodiments. The optical test information transmitted to and from the ICUTs need not be limited to the visible spectrum, but rather may be transmitted in the form of infrared radiation or ultaviolet radiation. Not all the integrated circuits on a wafer under test need to be tested at the same time. Where testing all the integrated circuits on a wafer would consume too much power, for example, smaller sets of the integrated circuits can be powered and tested, one set at a time. In some cases, ground traces are not provided on the face of the wafer to power the various integrated circuits under test. Rather, the integrated circuits may be adequately grounded by simply grounding the backside surface of the wafer under test. Where other structures are provided that can power and ground multiple integrated circuits on the wafer under test at the same time without the use of a probe needle, those other structures can be used in conjunction with the techniques described above for testing multiple integrated circuits simultaneously without the use of a probe card or probe needles. Rather than communicating test information to many integrated circuits at the same time, test information can be communicated to the integrated circuits of the wafer under test one integrated circuit at a time. Similarly, rather than many integrated circuits transmitting results of self-tests at the same time, the various integrated circuits of the wafer under test can be controlled to communicate the results of their self-tests one integrated circuit at a time. Although the photodetectors and phototransmitters are described above as being diodes, other types of photodetectors and phototransmitters can be used. Accordingly, various modifications, adaptations, and combinations of various features of the described embodiments can be practiced without departing from the scope of the invention as set forth in the following claims.

What is claimed is:

1. An optical testing port disposed on an integrated circuit, comprising:

a photodetector that receives an optical test signal and that outputs a corresponding electrical test signal, the electrical test signal carrying test input information;

a phototransmitter; and testing circuitry that receives the electrical test signal from the photodetector, that uses the test input information to test a circuit on the integrated circuit, and that outputs an electrical signal to the phototransmitter such that the phototransmitter transmits an optical signal indicative of a result of the test.

2. The optical testing port of claim 1, wherein the photodetector is a silicon diode, and wherein the phototransmitter is a silicon diode.

3. The optical testing port of claim 1, wherein the testing circuitry is a JTAG circuit, and wherein the optical testing port is an optical JTAG port.

4. An optical test port disposed on an integrated circuit, the optical test port comprising:

a photodetector;

a phototransmitter; and means for receiving the test input information from the photodetector, for using the test input information to perform a test on at least a portion of the integrated circuit, and for driving the phototransmitter such that a result of the test is output from the phototransmitter in optical form.

* * * * *